United States Patent [19]

Massender

[11] Patent Number: 4,586,370

[45] Date of Patent: May 6, 1986

[54] TESTER FOR ELECTRIC AND PNEUMATIC SYSTEMS OF VEHICULAR TRAILERS

[76] Inventor: Kenneth R. Massender, N. 6502 Pittsburg, Spokane, Wash. 99208

[21] Appl. No.: 555,299

[22] Filed: Nov. 25, 1983

[51] Int. Cl.⁴ .............................................. G01L 5/28
[52] U.S. Cl. .................................... 73/121; 340/52 F
[58] Field of Search ................. 73/121; 340/696, 52 F

[56] References Cited

U.S. PATENT DOCUMENTS 3,958,454  5/1976  Rasch .................................... 73/121

FOREIGN PATENT DOCUMENTS 1402847  8/1975  United Kingdom .................. 73/121

Primary Examiner—Stewart J. Levy
Assistant Examiner—Joseph W. Roskos
Attorney, Agent, or Firm—Keith S. Bergman

[57] ABSTRACT

A relatively small portable tester to test operative electric and pneumatic systems of vehicular trailers without use of an associated truck tractor. The tester provides a separated radio operated control module that allows visual inspection of the various electric and pneumatic systems by an operator while such systems are operated. The invention is interconnected to a trailer's systems by existing connectors without any required modification and provides self-contained pneumatic and electrical powering devices.

3 Claims, 2 Drawing Figures

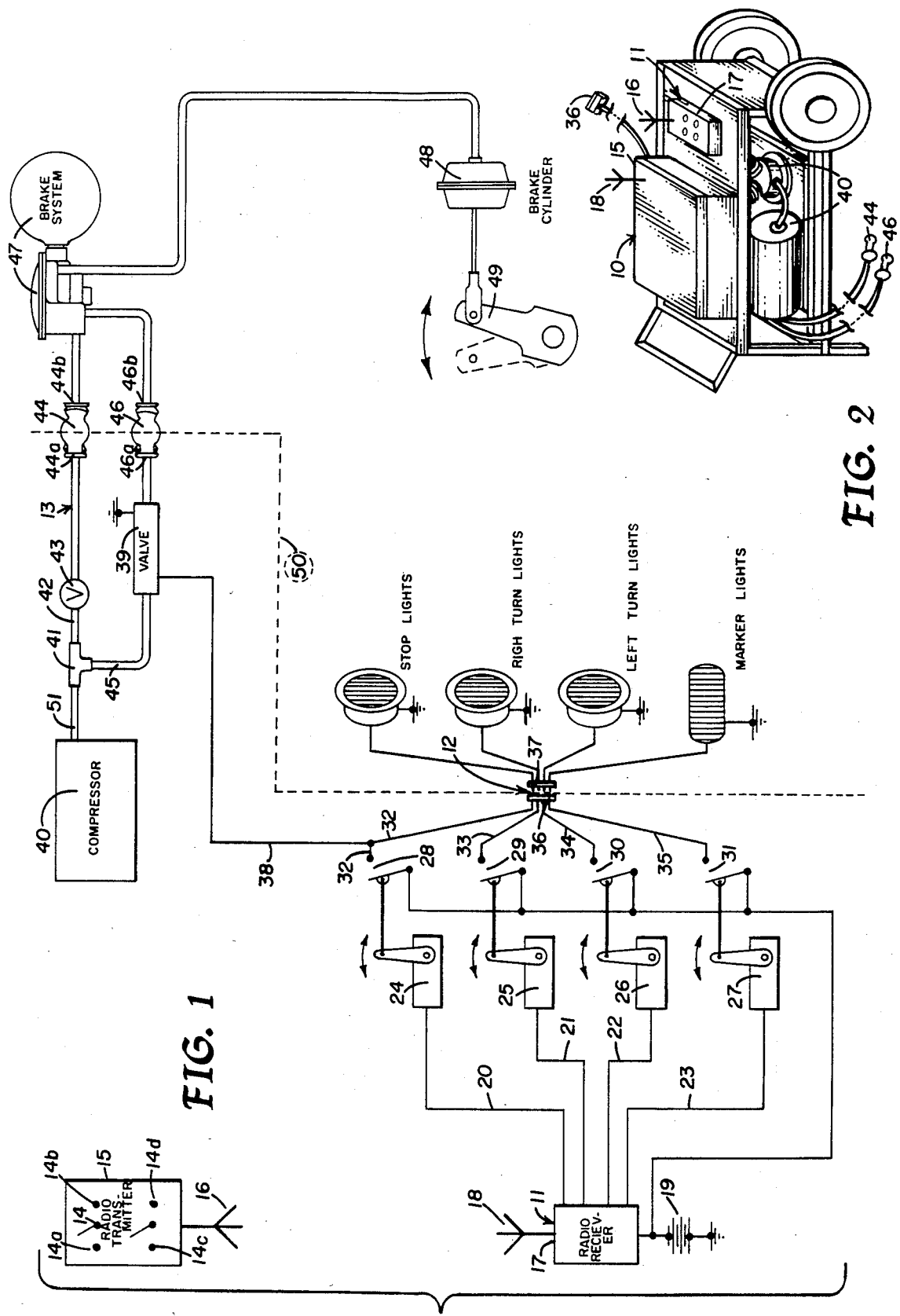

TESTER FOR ELECTRIC AND PNEUMATIC SYSTEMS OF VEHICULAR TRAILERS

BACKGROUND OF INVENTION

RELATED APPLICATIONS

There are no applications related hereto hertofore filed in this or any foreign country.

FIELD OF INVENTION

My invention relates generally to the testing of electric and pneumatic systems of vehicular trailers and more particularly to a portable testing device having a separable remote control module to allow simultaneous testing and inspection.

DESCRIPTION OF PRIOR ART

In both the truck operation and regulation enforcement fields it is important to know whether the electrical and pneumatic systems of vehicular trailers are properly operative. In general in the past it has been a common practice to check these systems by attaching a trailer to a truck tractor and thereafter using the control system of that truck tractor to activate the various electric lighting systems and penumatic braking systems to check operability. This operation, however, firstly requires the use of a truck tractor and secondly requires the services of two persons, one to operate the control mechanism in the tractor cab and the other to observe operation of the various lighting and braking functions from a position outside the tractor cab and about the trailer. This type of testing oftentimes is inconvenient, time consuming and expensive.

The instant invention seeks to remedy these problems by providing a self-contained testing unit with a separable remote control unit to allow testing of the trailer's electic and pneumatic systems without the use of a truck tractor and by one person. The testing device is relatively small in volume and mass, so that it can be contained readily in a small automotive vehicle or upon a cart for locomotion by manual manipulation. The primary testing unit provides one electrical connector and two pneumatic connectors to fasten to the traditional trailer system connectors of present day commerce. The separable control unit is relatively small, so that it can be hand held, and communicates by radio waves with the primary unit so that an operator may position himself at various places about a trailer to oberve the functions that are being tested without attendance being required at the primary testing unit.

In the prior art, the testing of trailer electrical and pneumatic systems has been accomplished in field operation by use of an associated truck tractor as before described or in production facilities by use of a tradional stationary testing panel. The instant invention differs from this prior art not only in the structure previously recited but also functionally in allowing field testing of trailer systems by use of a self-contained unit which is operated by one person. This saves considerable time, effort and expense and has brought the invention acceptance in both the law enforcement and operator areas of endeavor, one undoubtedly being motivated somewhat by the other.

The invention is further distinguished from existing art in that it uses readily available commercial components which contribute to its low cost, high reliability and ease of maintenance. My invention accepts the standardized commercial connectors almost universally used on all trailers to interconnect their electrical and pneumatic systems with external modules of such systems so that testing may be carried out without making any changes or modifications in existing trailers. In general the testing of trailer systems with my invention is more simple and less time consuming than the testing of such systems with associated truck tractors, prescinding from the difference in the required number of personnel in each operation.

My invention in providing such structure and function is distinguished from the prior art individualy or in any combination as hereinafter more particularly set forth.

SUMMARY OF INVENTION

My invention in general provides a small portable, hand held radio transmitter which communicates control signals to a radio receiver which in turn communicates through electromechanical switching mechanism to selectively operate an electric system and a pneumatic system both of which may be interconnected to the respective systems of a vehicular trailer. Both the electrical and pneumatic systems of my invention are self powered to provide normal output to the passive trailer systems for testing. An operator carrying the portable control unit may position himself at appropriate vantage points about the trailer to visually check its various lighting systems when they are operated by the control device and may inspect the operation of the braking system, and particularly the throw of the individual brakes, in the same fashion from a position about the trailer. In general my invention checks the operability of the marker lights, turn signal lights, and stop lights electrically and the functioning and throw of the braking system pneumatically, though it is expandable to check other operative features in either system if desired.

All parts of my invention, except the portable radio control transmitter, are normally closed associated for mobility either in an auxiliary automotive vehicle or upon a cart or similar structure.

In creating such a device it is:

A principal object of my invention to provide a portable, self powered tester, for the electrical and pneumatic systems of a vehicular trailer, that is operable by a single operator.

A further object of my invention to provide such a device that may be used with and connected to trailers of existing commerce without any modifications or changes.

A still further object of my invention to provide such a device that is relatively small in both mass and volume to allow its ready portability either by means of associated automotive type vehicle or cart.

A still further object of my invention to provide such a device that is formed from modular elements of present day commerce to provide simplicity in manufacturing, low cost and high reliability.

A still further object of my invention to provide such a device that is of new and novel design, of rugged and durable nature, of simple and economic manufacture and one otherwise well suited to the uses and purposes for which it is intended.

Other and further objects of my invention will appear from the following specification and accompanying drawings which form a part hereof. In carrying out the objects of my invention, however, it is to be understood that its essential features are susceptible of change in design, and structural arrangement with only one practical and preferred embodiment being illustrated in the accompanying drawings, as is required.

BRIEF DESCRIPTION OF DRAWINGS

In the accompanying drawings which form a part hereof and wherein like numbers of reference refer to similar parts throughout:

FIG. 1 is a diagrammatic representation, in normal symbology, of both the electrical and pneumatic systems of my invention.

FIG. 2 is an isometric surface view of the various components of my inventions mounted on a small cart for locomotion.

DESCRIPTION OF THE PREFERRED EMBODIMENT

My invention generally comprises a relatively small radio control transmitter 10 that sends plural distinguishable signals to radio receiver 11 that translates those signals to operate an electrical system 12 and a pneumatic system 13 associated therewith, both of which may be interconnected to the same systems of a vehicular trailer to test those systems.

Radio control transmitter 10 is of a type heretofore known especially by hobbyists to control various hobby vehicles during motion. The transmitter transmits a plurality of discrete, distinguishable radio signals responsive to the operation of a plurality of switching devices 14. Each of these signals is uniquely associated with one of the switches 14 so that the signal may be received and sensily used to perform a particular function. The transmitter is normally enclosed and protected by casement 15 and usually provides antenna 16 to aid signal transmission. The whole device is commonly not more than a few cubic inches in volume and of small mass to allow it to be hand held and readily manipulated. It is powered by its own battery supply (not shown). In the instance illustrated there are four normally open switches which generate four distinguishable signals which are enough for the purposes of my invention, though obviously more or less signals may be used to test more or less functions if desired.

The transmitter preferably transmits a signal in the citizen's band range of frequencies and one of relatively lower power to avoid licensing and interference problems. In general the radio signal transmitted need have an effective range of no more than a few hundred feet at best.

The transmitted radio signals are received by radio receiver 11. This receiver again is of the ordinary type used in radio controlled hobby equipment, providing casement 17 enclosing the transmitter equipment to protect it and antenna 18 to aid signal reception. The radio receiver is powered by battery 19 associated therewith. This battery is preferably a heavy duty vehicular type of appropriate voltage to operate the electrical systems of a trailer to be tested, commonly but not necessarily in the present day providing twelve volts.

Each of the four signals transmitted by illustrated transmitter 10, when received by the receiver 11, are translated by it into separate and distinct electrical pulses in one of output lines 20, 21, 22, 23. An electrical pulse in any of these lines operates the associated electro-mechanical device 24, 25, 26, 27, with which the line is interconnected, commonly a solenoid, to activate that device. In the case of solenoid mechanisms the signal will be translated into mechanical motion though undoubtedly electronic switching could be used with my invention if desired.

Each of the electro-mechanical devices operates one of the associated switches 28, 29, 30, 31. These switches are of the normally open, single throw, single pole variety and are respectively electrically interconnected in series between battery 19 and the several vehicular electrical circuits 32,33, 34,35. These various electrical circuits are associated in plug 36 which is adapted for releasable attachment to mating plug 37 commonly providd in vehicular trailer electrical circuts to allow releasable interconnection of those circuits fashion to the control and powering circuitry carried by a truck tractor.

Commonly there are four separate electrical circuits in the ordinary vehicular trailer. The circuitry actived by control line 32 is the stoplight circuit which activates upon brake pedal manipulation to indicate stopping and to control brake operations. The circuit activated by line 33 is the right turn signal circuitry which indicates by a blinking light on the right side of the vehicle that a right turn is imminent. The circuit activated by control line 34 is the left turn light signal that performs the same function for a left turn. The circuitry activated by control line 35 is a marker light circuit to provide the normal operative running lights for the trailer. Normally in ordinary vehicular electrical circuits, each of these circuits is of the one wire type powered from the positive side of a battery with the return circuit being provided by direct grounding to the vehicle frame, though obviously other types of electrical circuitry could exist in such vehicles and could be dealt with by my invention in similar fashion. Again, normally, trailer electrical plug 37 is of a reasonably standardized variety so that one tester plug 36 will operate with most existing trailer plugs of present day commerce, but obviously my tester plug may be adapted to particular situations if necessary.

The pneumatic braking system of a vehicular trailer may also be tested with my device. As shown in FIG. 1, electrical lead 38 communicates from stop light control line 32 to relay operated pneumatic valve 39. This valve is normally closed but openable upon passage of electric current through stop light control line 32 and brake control line 38. Compressor 40 communicates pneumatically through pneumatic line 51 to tee joint 41 which divides its output into two parallel lines. Line 42 communicates through manually manipuable valve 43 to truck brake line connector 44; line 45 passes to solenoid operated valve 39 and thence to emergency brake line connector 46. Each of these lines then communicates by pneumatic lines provided by the vehicle trailer to ordinary brake apparatus 47 and thence to individual cylinders 48 which move brake levers 49 to activate the individual braking systems.

All of the apparatus illustrated to the right from connectors 44, 46 comprise braking equipment carried by an ordinary vehicular trailer; this apparatus constitutes no part of my invention per se, but is illustrated in semi-diagrammatic form to aid in understanding the operation of my invention. The apparatus illustrated in FIG. 1 to the left of the dashed broken line constitutes my inverter per se.

Normally the parts of my invention per se as described will be associated in a compact grouping and preferably will be provided for mobility in one fashion or another. This may be accomplished by mounting the various elements on a wheeled cart of some sort or upon some type of small automotive vehicle so that the apparatus may be readily moved to trailers that are to be tested. The apparatus of my invention when formed from ordinarily commercially available parts will not occupy space of more than a few cubic feet and will not have a mass greater than a few hundred pounds so that it may be readily transported by small vehicles activated either by manual manipulation or some sort of motive power.

Compressor 40 supplies pressurized air at pressures normally used to service trailer braking systems, generally in the range of fifty to one hundred pounds per square inch. The compressor must be self powered by some motive force. I prefer a compressor powered by a gasoline motor, though in some instances it may be convenient to use an electrical motor and to power that motor from battery 19 which constitutes part of my testing apparatus, especially if overall mass or bulk is to be conserved. The power requirements of the compressor, however, are such as to rapidly drain the power from an ordinary vehicular type storage battery. The compressor is manually operable by reason of self contained control apparatus, though obviously remote control provisions, associated with my testing device, could be made for it.

Having thusly described my invention its operation may be understood.

Firstly a testing device is constructed according to the foregoing specifications and compressor 40 is activated to provide pneumatic pressues compatible with and required to operate the pneumatic systems of a vehicular trailer to be tested. The testing device is then moved into physical adjacency with the electrical and pneumatic connectors carried by a particular trailer to be tested, normally at the forward medial part of the trailer near its tongue. My tester is then interconnected by connecting the brake line connector 44a and emergency brake line connector 45a to the corresponding connectors 44b, 45b, carried by the trailer and electrical plug 36 of the testing device is interconnected with trailer electrical plug 37.

At this point compressor 40 will be supplying pressurized air through pneumatic line 42, which preconditions the braking system, and that line may be physically checked for leaks by observing auditorily any sound it makes, as if air is escaping from any orifice in the pneumatic system it will create an easily detectable and characteristic sound.

The tester operator then may take transmitter 10 and position himself about various portions of the trailer where he may observe the operation of the systems to be tested. As transmitter switch 14a is closed a signal will be sent by the transmitter to the receiver to operate switch 31 to pass a current into marker light control line thusly allowing current to flow from battery 19 into this circuit to activate the marker light system. Whether the system is properly operable may be visually observed by the operator by moving about the trailer to observe its various parts. When switch 14a is deactivatedl, solenoid 27 will deactivate to open switch 31 and remove electrical power from the marker system circuit.

When transmitter switch 14b is closed solenoid 26 will activate to close switch 30 to allow current to flow from battery 19 into the left turn signal circuit to activate that circuit. The operator will again position himself for visual observation of the left turn signal lights so that he may visually observe whether that system be operative. When transmitter switch 14b is opened, solenoid 26 will allow switch 30 to open to deactivate this circuit. The right turn signal circuitry may be tested in similar fashion by operation of right turn signal switch 14c of the transmitter.

The stop light circuitry is activated by transmitter switch 14d. When this switch be closed it, again, passes a signal to the receiver which responsively passes current through line 20 to operate solenoid 24 to close switch 28 and thusly allow current to flow from battery 19 to the stop light circuitry. The operation of the stop lights, again, may be visually observed by the tester operator's positioning himself appropriately to observe the operation of the various lights. Upon opening of switch 14d the stop light circuit is deactivated.

This stop light circuitry is also interconnected through electrical line 38 to solenoid operated pneumatic valve 39. This valve 39 is normally open but closable upon activation by the passage of current in the stoplight circuit from lines 32 through line 38. The closing of valve 39 will cause activation of the trailer braking system (normally a fail safe system) to ultimately operate brake cylinder 48 which will in turn move lever 49 to activate the braking pads of the system. By this operation, then, an operator may position himself at the point of ay one of the braking pads on the trailer and by operating the stop light system may simultaneously operate the brake system and then measure the throw of the braking arm 49 or of the braking pads to assure that the brake system is in proper working order. Again, on deactivation of the stop light system the braking system will be returned to its normal non-Operative condition. Obviously the particular testing system might operate with braking systems designed to brake upon loss of pressure or to brake upon increase of pressure, though most of the present day braking systems are of the first type, as illustrated.

After such testing of a particular trailer my apparatus may be quite readily disconnected from the releasable, trailer system connectors and be then ready for operation at some other location on some other trailer.

It is to be noted from the foregoing description that my tester may and, in fact, must be used without interconnection of a trailer to a truck tractor, as the tester contains its own powering system as well as switching mechanism.

It is further to be noted that the tester may be operated by a single operator to test a trailer's electrical and pneumatic system, whereas in testing by use of a truck tractor the services of two persons will be required, one in the cab to activate switching mechanisms and another positioned about the periphery of the trailer to observe various lighting and braking functions during operation.

It is further to be noted that my tester may be used with existing trailers of commerce without any changes or modifications in these trailers merely by interconnection with the existing pneumatic and electrical connectors almost universally provided by such trailers.

It is further to be noted that my tester is of a reasonably compact nature that can be mobilized quite readly for transport to the location of a trailer to be tested.

The foregoing description of my invention is necessarily of a detailed nature so that a specific embodiment of it might be set forth as required, but it is to be understood that various modifications of detail, rearrangement and multiplication of parts might be resorted to without departing from its spirit, essence or scope.

Having thusly described my invention, what I desire to protect by Letters Patent and,

What I claim is:

1. A self powered portable apparatus to test electric and electro-pneumatic systems of a vehicular trailer comprising, in combination:
   a portable, self powered radio transmitter having at least four normally open switches each of which may be closed to cause the transmitter to send distinguishable signals to a radio receiver;
   a radio receiver to receive the aforesaid signals and responsive thereto transmit an electric current in at least four electrical circuits, the transmittal of current in any one circuit being responsive to closure of a particular transmitter switch;
   each of said electrical circuits having an electro-mechanical device to operate, upon receipt of electric current, to close a normally open switch, each of said switches being in parallel with a source of electrical energy and in series with one of the electrical circuits of a vehicular trailer to pass electric current to a trailer circuit upon closure of the aforesaid switch in said circuit.

2. The invention of claim 1 further characterized by:
   a self powered pneumatic compressor having two parallel pneumatic circuits releasably interconnectable to pneumatic brake lines of a vehicular trailer, oneof said circuits having a normally open electro-mechanical pneumatic valve interconnected to one electrical circuit to change state of the electromechanical pneumatic valve.

3. A self contained portable tester for the electrical and electro-pneumatic systems of a vehicular trailer having two standardized releasable pneumatic connectors to pressurize and control an automatic braking system and at least four electrical systems including a stop light system, right turn light system, left turn light system and marker light system, all interconnectable by means of a standardized electrical plug, comprising in combination:
   a self powered, portable radio transmitter having at least four normally open switches each adapted upon manual closure to cause the radio transmitter to send a unique distinguishable signal to
   a radio receiver adapted to receive said signals and responsive to a particular signal thereto transmit a discrete electrical signal in only one of four control electrical circuits during such transmittal,
   each of said control electrical circuits having an electro-mechanical device operative upon receipt of current to close a normally open switch each of said switches being in parallel with a source of electromotive power, and
   each of said control electrical circuits being interconnectable by a plug type connector with a trailer electrical system plug to pass current respectively to the stop light circuit, right turn light circuit, left turn light circuit and marker light circuit of a vehicular trailer upon closure of the switch associated with said control circuit; and
   a self powered compressor having a pneumatic output through two parallel pneumatic lines, each having a connector to releasably interconnect with the pneumatic connectors provided by two pneumatic brake circuits of a trailer, the pneumatic line interconnecting with the braking line of the trailer having a normally open electro-pneumatic valve closable responsive to receipt of electric current thereby, said electro-mechanical valve being electrically interconnected to the stop light control circuit of the tester, to receive electric current therefrom to close said electro-pneumatic valve responsive thereto.

* * * * *